United States Patent
Tsai et al.

(10) Patent No.: US 10,867,932 B2
(45) Date of Patent: Dec. 15, 2020

(54) METHOD FOR MANUFACTURING PACKAGE STRUCTURE

(71) Applicant: TAIWAN SEMICONDUCTOR MANUFACTURING CO., LTD., Hsinchu (TW)

(72) Inventors: Yi-Da Tsai, Dongshi Township, Chiayi County (TW); Cheng-Ping Lin, Hsinchu County (TW); Wei-Hung Lin, Xinfeng Township, Hsinchu County (TW); Chih-Wei Lin, Zhubei (TW); Ming-Da Cheng, Taoyuan (TW); Ching-Hua Hsieh, Hsinchu (TW); Chung-Shi Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/741,001

(22) Filed: Jan. 13, 2020

(65) Prior Publication Data
US 2020/0152576 A1    May 14, 2020

Related U.S. Application Data

(62) Division of application No. 16/020,030, filed on Jun. 27, 2018, now Pat. No. 10,535,609, which is a
(Continued)

(51) Int. Cl.
*H01L 23/538* (2006.01)
*H01L 21/56* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
None
See application file for complete search history.

(56) References Cited

U.S. PATENT DOCUMENTS 8,288,209 B1    10/2012   Chi et al.
8,361,842 B2    1/2013    Yu et al.
(Continued)

FOREIGN PATENT DOCUMENTS

CN    103219293 A    7/2013
CN    104851816 A    8/2015

OTHER PUBLICATIONS

U.S. Appl. No. 16/020,030, filed Jun. 27, 2018.

*Primary Examiner* — Khaja Ahmad
(74) *Attorney, Agent, or Firm* — Birch, Stewart, Kolasch & Birch, LLP

(57) ABSTRACT

Package structures and methods for forming the same are provided. The method includes forming a redistribution structure embedded in a passivation layer over a carrier substrate and bonding an integrated circuit die to the redistribution structure through first connectors. The method further includes removing the carrier substrate to expose a bottom portion of the redistribution structure and removing the bottom portion of the redistribution structure to form an opening in the passivation layer. The method further includes forming a second connector over the redistribution structure. In addition, the second connector includes an extending portion extending into the opening in the passivation layer.

20 Claims, 14 Drawing Sheets

Related U.S. Application Data division of application No. 15/347,912, filed on Nov. 10, 2016, now Pat. No. 10,014,260.

(51) Int. Cl.

| | | |
|---|---|---|
| *H01L 21/48* | (2006.01) | |
| *H01L 21/683* | (2006.01) | |
| *H01L 23/29* | (2006.01) | |
| *H01L 23/31* | (2006.01) | |
| *H01L 23/00* | (2006.01) | |
| *H01L 25/00* | (2006.01) | |
| *H01L 25/065* | (2006.01) | |

(52) U.S. Cl.
CPC ............ *H01L 21/56* (2013.01); *H01L 21/561* (2013.01); *H01L 21/565* (2013.01); *H01L 21/568* (2013.01); *H01L 21/6835* (2013.01); *H01L 23/295* (2013.01); *H01L 23/3135* (2013.01); *H01L 23/5386* (2013.01); *H01L 24/17* (2013.01); *H01L 24/81* (2013.01); *H01L 24/96* (2013.01); *H01L 24/97* (2013.01); *H01L 23/3128* (2013.01); *H01L 24/13* (2013.01); *H01L 24/16* (2013.01); *H01L 24/32* (2013.01); *H01L 24/73* (2013.01); *H01L 25/0655* (2013.01); *H01L 25/50* (2013.01); *H01L 2221/68345* (2013.01); *H01L 2221/68381* (2013.01); *H01L 2224/1146* (2013.01); *H01L 2224/11462* (2013.01); *H01L 2224/13101* (2013.01); *H01L 2224/13144* (2013.01); *H01L 2224/13147* (2013.01); *H01L 2224/13155* (2013.01); *H01L 2224/13164* (2013.01); *H01L 2224/16227* (2013.01); *H01L 2224/73204* (2013.01); *H01L 2224/81005* (2013.01); *H01L 2224/81193* (2013.01); *H01L 2224/81815* (2013.01); *H01L 2924/1203* (2013.01); *H01L 2924/1304* (2013.01); *H01L 2924/15311* (2013.01); *H01L 2924/181* (2013.01); *H01L 2924/18161* (2013.01); *H01L 2924/3511* (2013.01)

(56) References Cited

U.S. PATENT DOCUMENTS

| | | | |
|---|---|---|---|
| 8,680,647 | B2 | 3/2014 | Yu et al. |
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 2005/0039948 | A1 | 2/2005 | Asai et al. |
| 2009/0315156 | A1 | 12/2009 | Harper |
| 2010/0140759 | A1 | 6/2010 | Pagaila et al. |
| 2011/0140263 | A1* | 6/2011 | Camacho .......... H01L 23/49548 257/692 |
| 2011/0254156 | A1 | 10/2011 | Lin |
| 2011/0291288 | A1 | 12/2011 | Wu et al. |
| 2012/0018858 | A1 | 1/2012 | Chen et al. |
| 2012/0228749 | A1* | 9/2012 | Pagaila ............. H01L 23/49838 257/659 |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0264684 | A1 | 10/2013 | Yu et al. |
| 2013/0307140 | A1 | 11/2013 | Huang et al. |
| 2014/0203429 | A1 | 7/2014 | Yu et al. |
| 2014/0225222 | A1 | 8/2014 | Yu et al. |
| 2014/0252646 | A1 | 9/2014 | Hung et al. |
| 2014/0264930 | A1 | 9/2014 | Yu et al. |
| 2015/0179570 | A1 | 6/2015 | Marimuthu et al. |
| 2015/0214110 | A1 | 7/2015 | Lin et al. |
| 2016/0240480 | A1* | 8/2016 | Lin ..................... H01L 23/3135 |
| 2016/0276307 | A1 | 9/2016 | Lin |
| 2017/0243826 | A1* | 8/2017 | Lin ....................... H01L 21/486 |
| 2017/0338128 | A1* | 11/2017 | Huang ............. H01L 23/49816 |

* cited by examiner

METHOD FOR MANUFACTURING PACKAGE STRUCTURE

PRIORITY CLAIM AND CROSS-REFERENCE

This Application is a divisional application of U.S. application Ser. No. 16/020,030, filed on Jun. 27, 2018, the entirety of which is incorporated by reference herein. The U.S. application Ser. No. 16/020,030 is a divisional application of U.S. application Ser. No. 15/347,912, filed on Nov. 10, 2016, the entirety of which is incorporated by reference herein.

BACKGROUND

With the constant evolution of semiconductor technology, semiconductor dies are increasingly becoming smaller. More functions, however, need to be integrated into these semiconductor dies. Accordingly, these semiconductor dies have increasingly greater numbers of I/O pads packaged into smaller areas, and the density of the I/O pads is quickly rising. As a result, the packaging of semiconductor dies is becoming more difficult.

Package technologies can be divided into multiple categories. In one of the categories of packaging, dies are sawed from wafers before they are packaged onto other wafers, and only "known-good-dies" are packaged. An advantage of this packaging technology is the possibility of forming fan-out chip packages, which means that the I/O pads on a die can be redistributed to a greater area than the die itself. Therefore, the number of I/O pads packed on the surfaces of the dies can be increased.

New packaging technologies have been developed to further improve the density and functions of semiconductor dies. These relatively new types of packaging technologies for semiconductor dies face manufacturing challenges, and they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
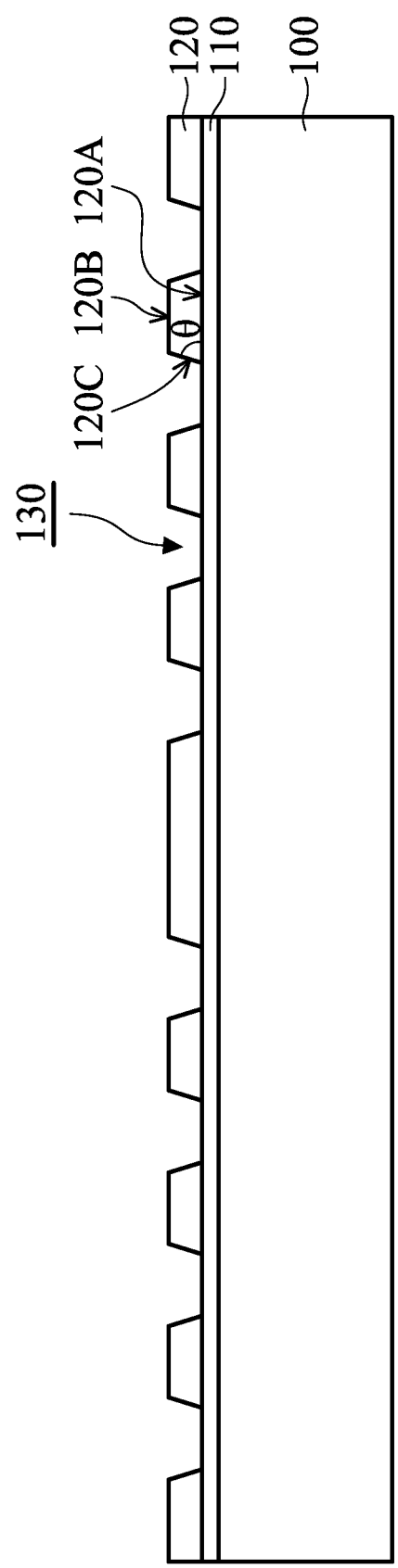
FIGS. 1A-1I are cross-sectional views of various stages of a process for forming a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
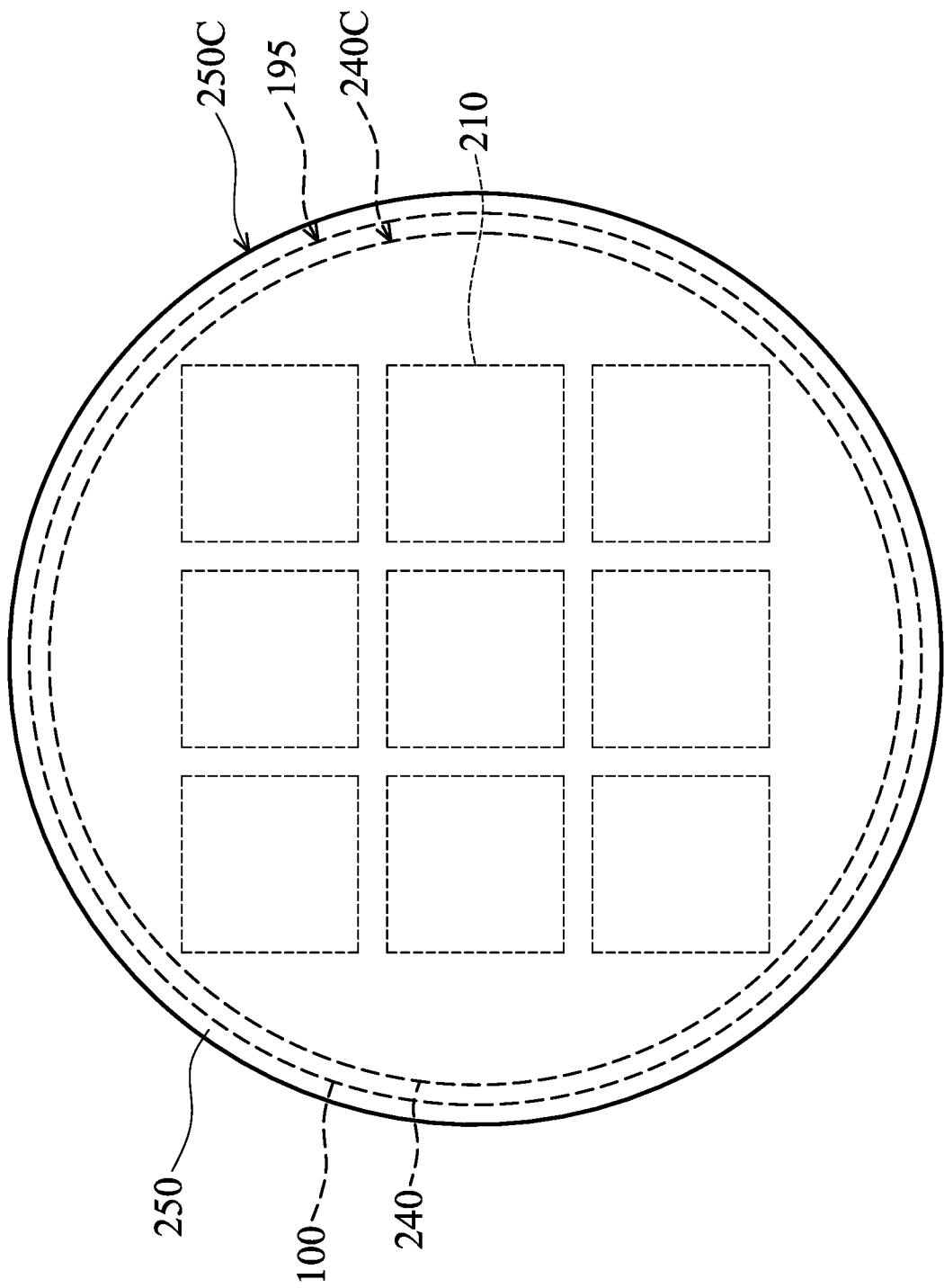
FIG. 2 is a top view of one stage of a process for forming a package structure, in accordance with some embodiments.
Figure 3:
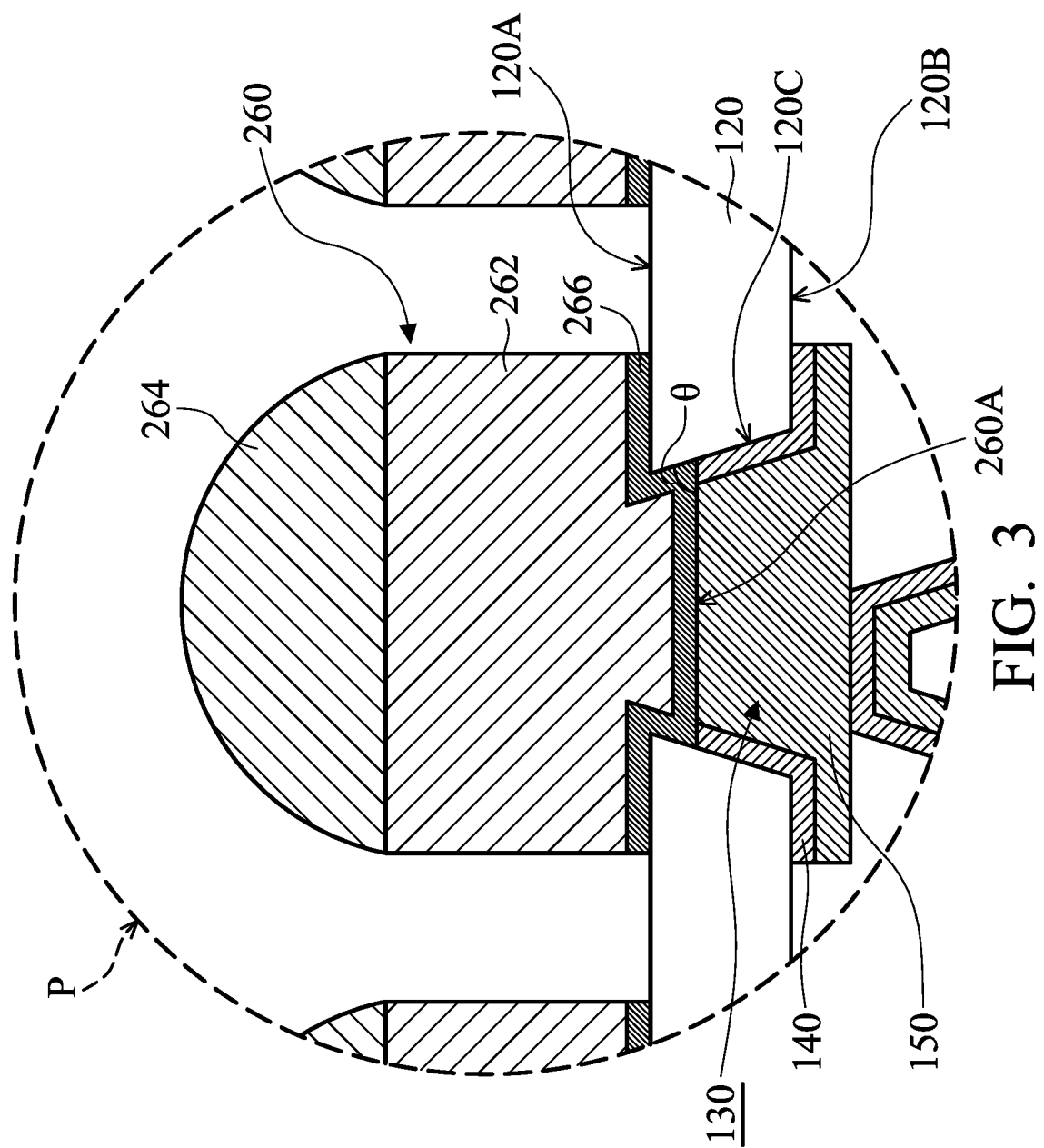
FIG. 3 is an enlarged cross-sectional view of a package structure, in accordance with some embodiments.

Some embodiments of the disclosure are described. FIGS. 1A-1I are cross-sectional views of various stages of a process for forming a package structure, in accordance with some embodiments. FIG. 2 is a top view of one stage of a process for forming a package structure, in accordance with some embodiments. FIG. 3 is an enlarged cross-sectional view of a package structure, in accordance with some embodiments.

Additional operations can be provided before, during, and/or after the stages described in FIGS. 1A-1I. Some of the stages that are described can be replaced or eliminated for different embodiments. Additional features can be added to the package structure. Some of the features described below can be replaced or eliminated for different embodiments. Although some embodiments are discussed with operations performed in a particular order, these operations may be performed in another logical order.

As shown in FIG. 1A, a carrier substrate 100 is provided, in accordance with some embodiments. In some embodiments, the carrier substrate 100 is used as a temporary substrate. The temporary substrate provides mechanical and structural support during subsequent processing steps, such as those described in more detail later. Afterwards, the carrier substrate 300 may be removed.

In some embodiments, the carrier substrate 100 includes a semiconductor substrate, a glass substrate, a ceramic substrate, a polymer substrate, another suitable substrate, or a combination thereof. In some embodiments, the carrier substrate 100 is a silicon wafer or another suitable wafer.

Afterwards, an adhesive layer 110 is deposited over the carrier substrate 100, in accordance with some embodiments. The adhesive layer 110 may be made of glue, or may be a lamination material, such as a foil. In some embodiments, the adhesive layer 110 is photosensitive and is easily detached from the carrier substrate 100 by light irradiation. For example, shining ultra-violet (UV) light or laser light on the carrier substrate 100 is used to detach the adhesive layer 110. In some embodiments, the adhesive layer 110 is a light-to-heat-conversion (LTHC) coating. In some other embodiments, the adhesive layer 110 is heat-sensitive and is easily detached from the carrier substrate 100 when it is exposed to heat.

Subsequently, a passivation layer 120 with openings 130 is formed over the adhesive layer 110, in accordance with some embodiments. As a result, the adhesive layer 110 is partially exposed from the openings 130.

The passivation layer 120 has a surface 120A that faces the adhesive layer 110, and a surface 120B that faces away from the adhesive layer 110. The passivation layer 120 has a sidewall 120C adjoining one of the openings 130. In some embodiments, the sidewall 120C is inclined to the surfaces 120A and 120B. In some embodiments, there is an acute angle between the sidewall 120C and the surface 120A. In some embodiments, the angle θ between the sidewall 120C and the surface 120A is greater than 0° and is less than or substantially equal to 90°. However, embodiments of the disclosure are not limited thereto. In some other embodiments, the sidewall 120C is substantially perpendicular to the surfaces 120A and 120B.

In some embodiments, the passivation layer 120 is made of a polymer material. In some embodiments, the passivation layer 120 includes polyimide, polybenzoxazole (PBO), benzocyclobutene (BCB), silicone, acrylates, siloxane, another suitable material, or a combination thereof. In some other embodiments, the passivation layer 120 includes non-organic materials. The non-organic materials may include silicon oxide, un-doped silicate glass, silicon oxynitride, solder resist (SR), silicon nitride, silicon carbide, hexamethyldisilazane (HMDS), another suitable material, or a combination thereof.

Multiple deposition, coating, and/or etching processes may be used to form the passivation layer 120 with the openings 130. For example, a chemical vapor deposition (CVD) process or a spin-on coating process may be used to deposit the passivation layer 120. Afterwards, an etching process may be used to form the openings 130.

Figure 1B:
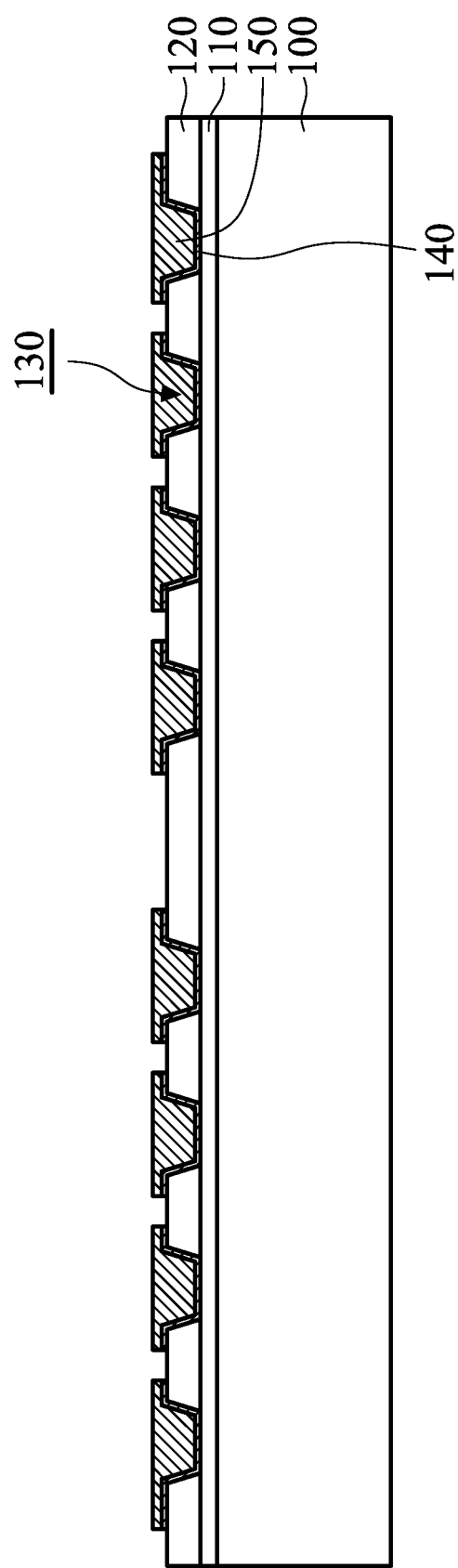

As shown in FIG. 1B, a patterned redistribution layer including conductive layers 140 and 150 is formed over the passivation layer 120, in accordance with some embodiments. The conductive layers 140 and 150 extend along the surface 120B of the passivation layer 120 and extend into the openings 130 of the passivation layer 120. The conductive layer 140 is between the conductive layer 150 and the surface 120B and extends between the conductive layer 150 and the sidewall 120C.

In some embodiments, the openings 130 are substantially fully filled with the conductive layers 140 and 150. In some other embodiments, the openings 130 are substantially fully filled with the conductive layers 140 and 150 and another material layer.

In some embodiments, the conductive layer 140 is a seed layer and is thinner than the conductive layer 150. In some embodiments, the conductive layer 140 includes titanium (Ti). However, embodiments of the disclosure are not limited thereto. For example, the conductive layer 140 may include Ti alloy, copper (Cu), Cu alloy, another suitable seed material, or a combination thereof. The Ti alloy or the Cu alloy may include silver, chromium, nickel, tin, gold, tungsten, another suitable element, or a combination thereof. In some embodiments, the conductive layer 140 is deposited using a physical vapor deposition (PVD) process, a CVD process, another applicable process, or a combination thereof.

In some embodiments, the conductive layer 150 is made of a metal material. The metal material includes Cu, aluminum (Al), tungsten (W), gold (Au), another suitable material, or a combination thereof. In some embodiments, the conductive layer 150 is deposited using an electroplating process, a sputtering process, another applicable process, or a combination thereof. Multiple etching processes may be used to pattern the conductive layers 140 and 150 to form the patterned redistribution layer.

Figure 1C:
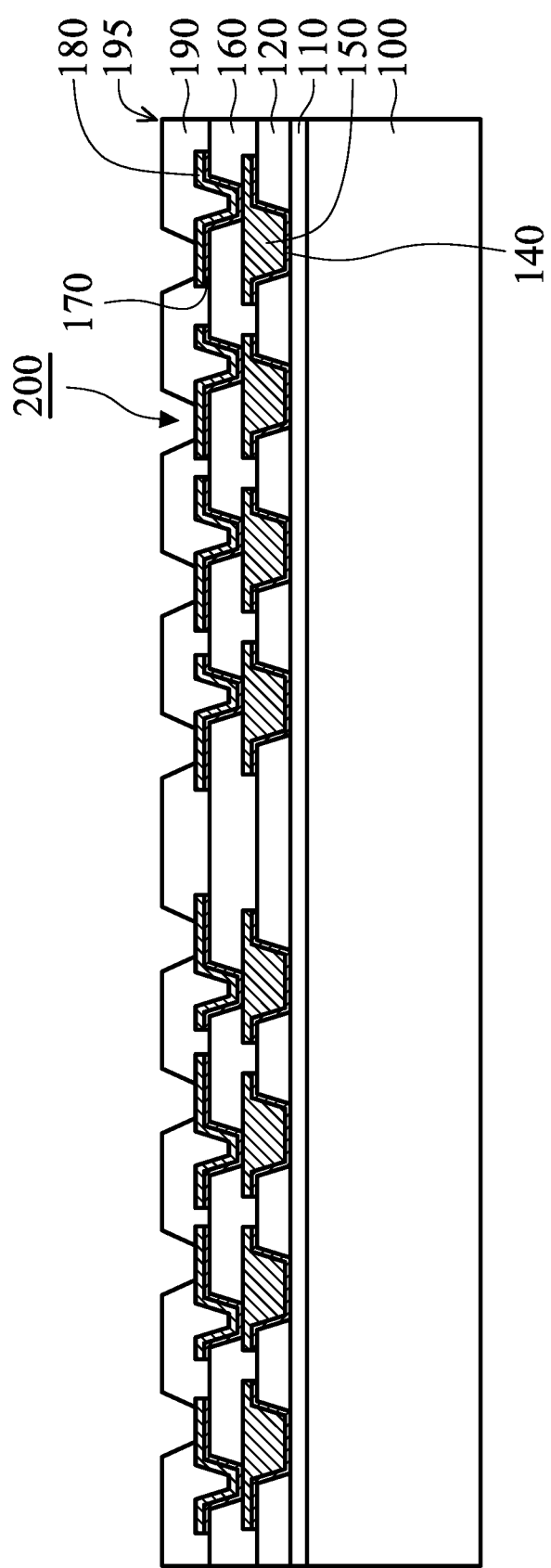

As shown in FIG. 1C, a passivation layer 160 with openings is formed over the passivation layer 120 and the conductive layer 150, in accordance with some embodiments. The conductive layer 150 is partially exposed from the openings of the passivation layer 160. In some embodiments, the materials and/or formation methods of the passivation layer 160 are similar to those of the passivation layer 120.

Afterwards, a patterned redistribution layer including conductive layers 170 and 180 is formed over the passivation layer 160, in accordance with some embodiments. The conductive layers 170 and 180 extend into the openings of the passivation layer 160. In some embodiments, the materials and/or formation methods of the conductive layers 170 and 180 are similar to those of the conductive layers 140 and 150, respectively.

Subsequently, a passivation layer 190 with openings 200 is formed over the passivation layer 160 and the conductive layer 180, in accordance with some embodiments. As a result, the conductive layer 180 is partially exposed from the openings 200 to provide a landing area for connectors, which will be described in more detail later. The passivation layer 190 may or may not fill the openings of the passivation layer 160. In some embodiments, the passivation layers 120, 160 and 190 and the carrier substrate 100 have a substantially coplanar sidewall or edge 195. In some embodiments, the materials and/or formation methods of the passivation layer 190 are similar to those of the passivation layer 120.

Figure 1D:
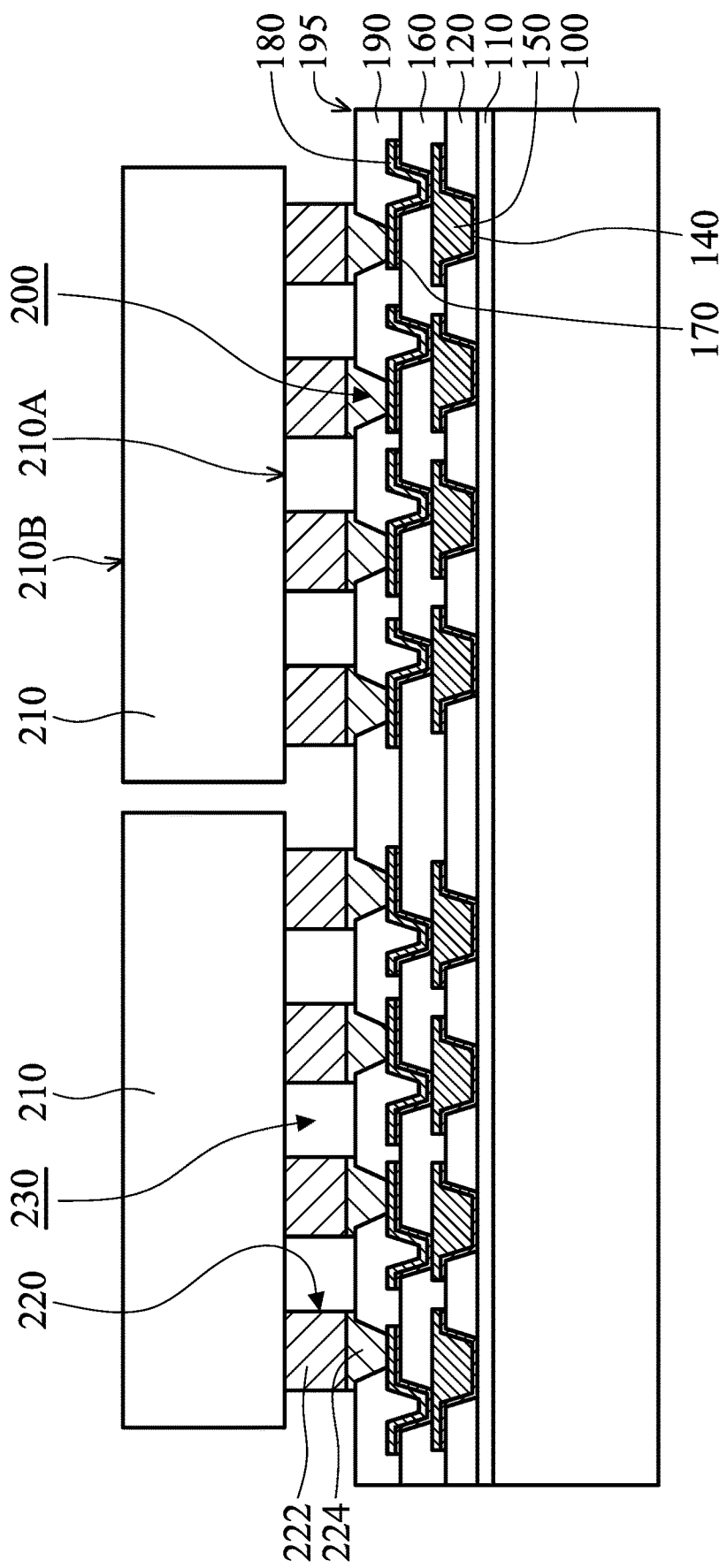

As shown in FIG. 1D, multiple integrated circuit dies 210 are bonded to the exposed portions of the conductive layer 180 through connectors 220, in accordance with some embodiments. The integrated circuit dies 210 are electrically connected to the redistribution layers including the conductive layers 150, 160, 170 and 180 through the connectors 220. In some embodiments, the integrated circuit dies 210 are arranged in an array inside edge 195, as shown in FIG. 2.

In some embodiments, the integrated circuit dies 210 have an active surface 210A that faces the passivation layer 190, and a non-active surface 210B that faces away from the passivation layer 190. In some embodiments, there is a space 230 between the active surface 210A of the integrated circuit dies 210 and the passivation layer 190.

The integrated circuit dies 210 are device dies including transistors, diodes, or another suitable integrated circuit element. The device dies may also include capacitors, inductors, resistors, another integrated circuit element, or a combination thereof. In some embodiments, the integrated circuit dies 210 are sensor dies, logic dies, central processing unit (CPU) dies, memory dies, or another suitable dies. For example, the integrated circuit dies 210 may be High-Bandwidth Memory (HBM) elements, System on Chip (SoC) elements, or a combination thereof.

In some embodiments, each of the connectors 220 includes a conductive bump 222 and a solder layer 224. The conductive bump 222 is between one of the integrated circuit dies 210 and the solder layer 224. The conductive bump 222 may be a conductive pillar, another suitable conductive feature, or a combination thereof. In some embodiments, the conductive bump 222 includes copper, electroless nickel immersion gold (ENIG), electroless nickel electroless palladium immersion gold (ENEPIG), another suitable material, or a combination thereof.

In some embodiments, the solder layer 224 is over the passivation layer 190 and fills the openings 200 to electrically connect to the conductive layer 180. In some embodiments, a reflow process is performed to bond the solder layer 224 and the conductive layer 180 together. However, embodiments of the disclosure are not limited thereto. In some other embodiments, the solder layer 224 is electrically connected to the conductive layer 180 through another connector in the openings 200.

Many variations and/or modifications can be made to embodiments of the disclosure. In some other embodiments, the connectors 220 do not include conductive pillars. In some other embodiments, the connectors 220 are solder bumps, solder balls, other suitable connectors, or a combination thereof.

Figure 1E:
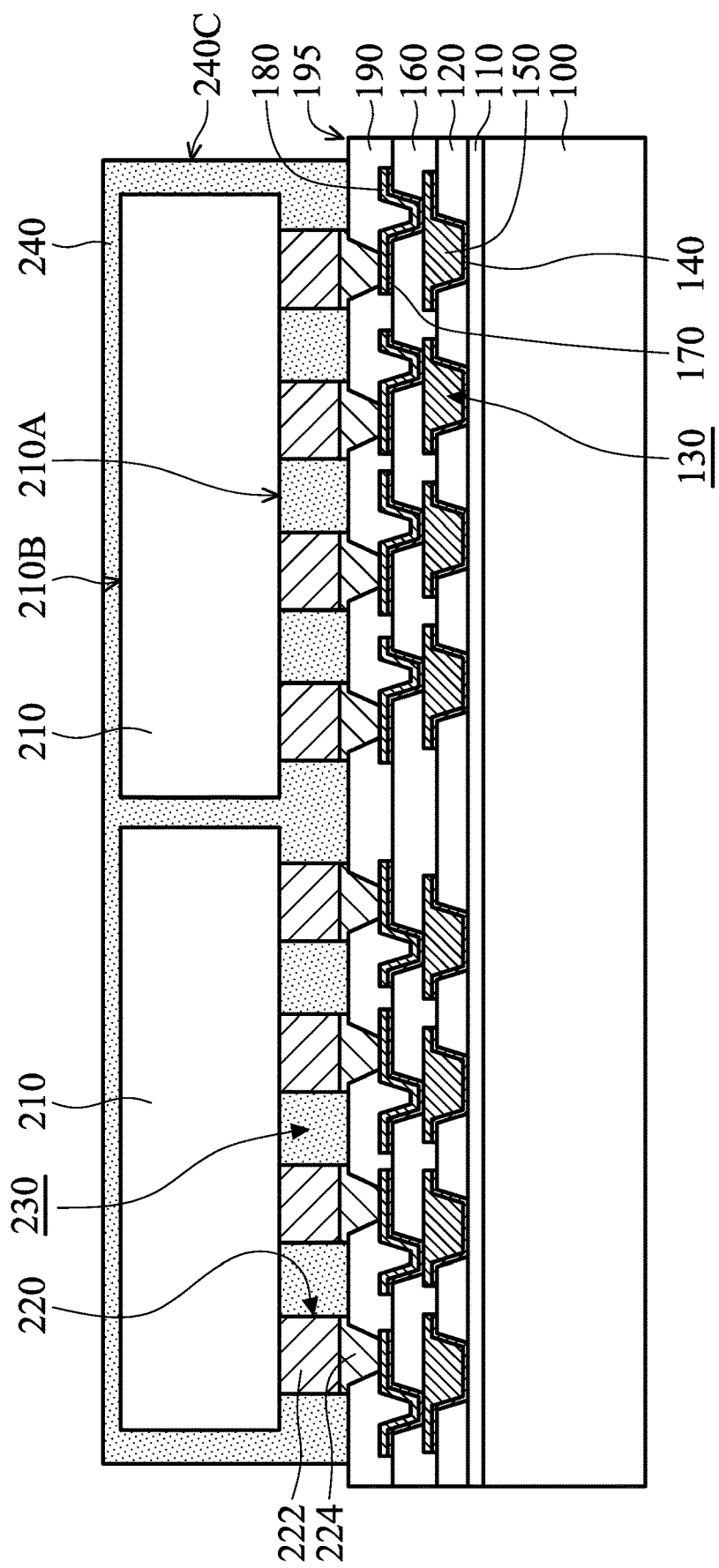

As shown in FIG. 1E, a package layer 240 is formed over the passivation layer 190, in accordance with some embodiments. In some embodiments, the package layer 240 extends over the non-active surface 210B of the integrated circuit dies 210. As a result, the integrated circuit dies 210 are embedded in the package layer 240. In some embodiments, the package layer 240 has a sidewall 240C that is not aligned to the edge 195. In some embodiments, the sidewall 240C is substantially parallel to the edge 195.

In some embodiments, the package layer 240 fills the space 230 between the integrated circuit dies 210 and the passivation layer 190. As a result, the package layer 240 continuously surrounds the connectors 220. In some embodiments, the package layer 240 is in direct contact with the connectors 220, the integrated circuit dies 210 and the passivation layer 190.

Many variations and/or modifications can be made to embodiments of the disclosure. In some other embodiments, the space 230 is filled with another package layer that is surrounded by the package layer 240. As a result, the package layer 240 is not in direct contact with the connectors 220.

As shown in FIG. 2, the package layer 240 extends along the edge 195, in accordance with some embodiments. As a result, the package layer 240 continuously surrounds the integrated circuit dies 210. In some embodiments, the package layer 240 is spaced apart from the edge 195. In some embodiments, the package layer 240 is retracted inwardly from the edge 195. In some embodiments, the package layer 240 has a size or diameter that is less than that of the carrier substrate 100. As a result, the package layer 240 partially exposes the passivation layer 190.

In some embodiments, the package layer 240 includes a polymer material or another suitable encapsulating material. In some embodiments, the package layer 240 includes a molding compound. In some embodiments, the package layer 240 has a coefficient of thermal expansion (CTE) in a range from about 9 ppm/° C. to about 20 ppm/° C. In some embodiments, the package layer 240 has fillers dispersed therein. The fillers may include insulating fibers, insulating particles, other suitable elements, or a combination thereof. In some embodiments, the content or concentration of the fillers dispersed in the package layer 240 is in a range from about 70 wt % to about 85 wt %. In some embodiments, the size of the fillers dispersed in the package layer 240 is in a range from about 10 µm to about 20 µm. In some embodiments, the package layer 240 is formed by an immersion molding process, another applicable process, or a combination thereof.

Figure 1F:
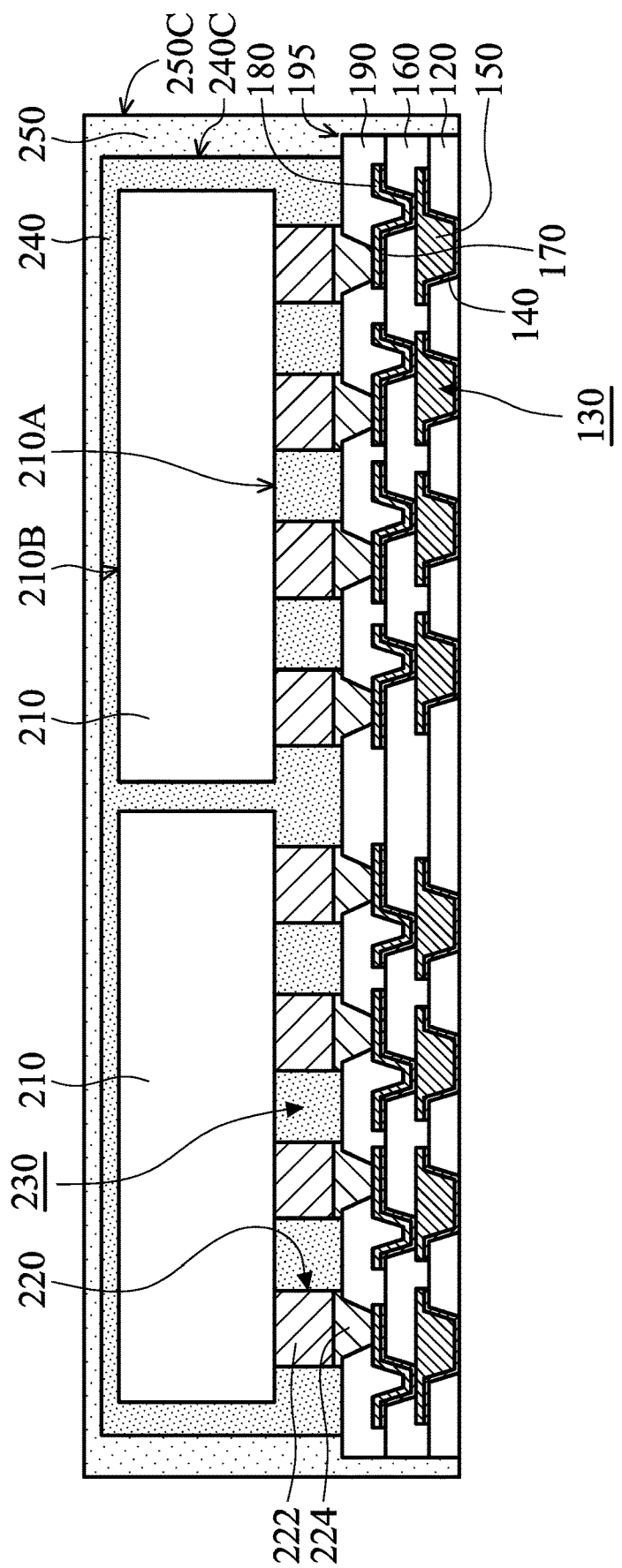

As shown in FIG. 1F, a package layer 250 is formed over the passivation layer 190, in accordance with some embodiments. The package layer 250 caps the package layer 240 and the integrated circuit dies 210. In some embodiments, the package layer 250 covers the sidewall 240C of the package layer 240. In some embodiments, the package layer 250 extends over the non-active surface 210B of the integrated circuit dies 210 to cover the top surface of the package layer 240. As a result, the package layer 240 is embedded in the package layer 250.

In some embodiments, the package layer 250 is in direct contact with the package layer 240 and the passivation layer 190. In some embodiments, the package layer 250 extends from the sidewall 240C of the package layer 240 to the edge 195. In some embodiments, the package layer 250 further extends to cover the edge 195. In some embodiments, the package layer 250 has a sidewall 250C that is not aligned to the sidewall 240C and the edge 195. In some embodiments, the sidewall 250C is substantially parallel to the sidewall 240C and/or the edge 195.

As shown in FIG. 2, the package layer 250 extends along the edge 195, in accordance with some embodiments. As a result, the package layer 250 continuously surrounds the edge 195. In some embodiments, the package layer 250 extends across the edge 195. In some embodiments, the package layer 250 has a size or diameter that is greater than that of the carrier substrate 100 and the package layer 240.

In some embodiments, the package layer 250 includes a polymer material or another suitable encapsulating material. In some embodiments, the package layer 250 includes a molding compound. In some embodiments, the package layers 240 and 250 include the same material. However, embodiments of the disclosure are not limited thereto. In some other embodiments, the package layers 240 and 250 include different materials. The package layer 250 may include multiple sub-layers.

In some embodiments, the package layer 250 has a CTE in a range from about 15 ppm/° C. to about 35 ppm/° C. The CTE of the package layer 250 may be less than, substantially equal to or greater than that of the package layer 240. The CTE of the package layer 250 can be varied according to requirements.

In some embodiments, the package layer 250 has fillers dispersed therein. The fillers may include insulating fibers, insulating particles, other suitable elements, or a combination thereof. In some embodiments, the content or concentration of the fillers dispersed in the package layer 250 is in a range from about 65 wt % to about 80 wt %. In some embodiments, the size of the fillers dispersed in the package layer 250 is in a range from about 20 µm to about 75 µm. In some embodiments, the fillers dispersed in the package layer 250 have a (maximum) size that is greater than the fillers dispersed in the package layer 240.

In some embodiments, the package layer 250 is formed by a compression molding process, an immersion molding process, another applicable process, or a combination thereof. In some embodiments, a liquid molding compound material is applied over the passivation layer 190 and the package layer 240 to encapsulate and cap the package layer 240 and the integrated circuit dies 210. In some embodiments, a thermal process is then applied to harden the molding compound material and to transform it into the package layer 250. In some embodiments, the thermal process is performed at a temperature in a range from about 200° C. to about 230° C. The operation time of the thermal process may be in a range from about 1 hour to about 3 hours.

As shown in FIG. 1F, the carrier substrate 100 is removed from the passivation layer 120, in accordance with some embodiments. As a result, the conductive layer 140 in the openings 130 of the passivation layer 120 is partially exposed. In some embodiments, the carrier substrate 100 is detached from the passivation layer 120 by light irradiation on the adhesive layer 110.

In some embodiments, the carrier substrate 100 is detached from the passivation layer 120 after the formation of the package layer 250. As a result, the conductive layer 140 in the openings 130 is protected by the carrier substrate 100 during the formation of the package layer 250. However, embodiments of the disclosure are not limited thereto. In some other embodiments, the carrier substrate 100 is detached from the passivation layer 120 before the formation of the package layer 250.

Figure 1G:
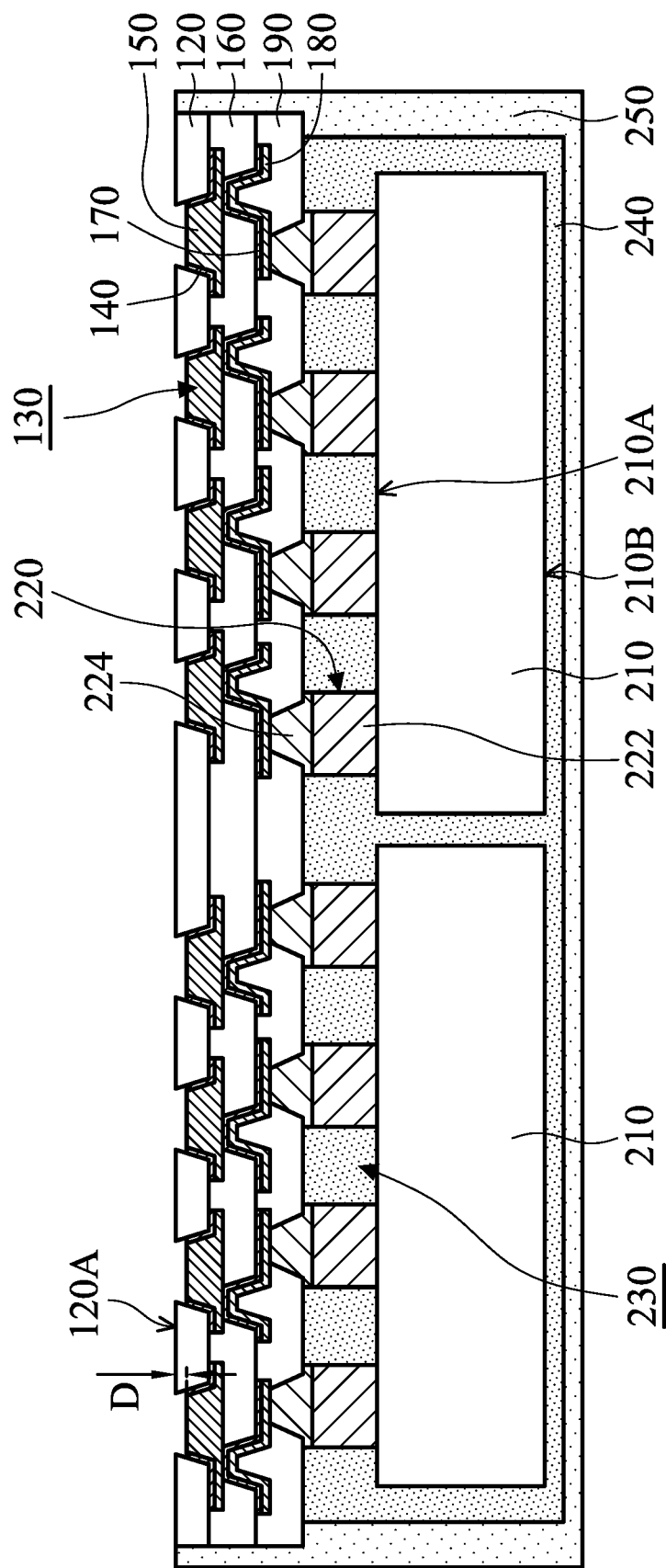

As shown in FIG. 1G, the structure shown in FIG. 1F is reversed. As a result, the integrated circuit dies 210 are supported by the package layers 240 and 250 after the removal of the carrier substrate 100. In some embodiments, there is no carrier substrate attached to the package layers 240 and 250 during subsequent processes.

As shown in FIG. 1G, the exposed portions of the conductive layer 140 are recessed in the openings 130, in accordance with some embodiments. As a result, the conductive layer 150 in the openings 130 is partially exposed. There is a recessed depth D that is measured from the surface 120A of the passivation layer 120 to the recessed conductive layer 140. In some embodiments, the recessed depth D is in a range from about 0.01 μm to about 0.5 μm.

In some embodiments, an etching process is used to recess the exposed portions of the conductive layer 140. The etching process is a dry etching process or a wet etching process. In some embodiments, the etching process is performed until the conductive layer 150 is exposed. In some embodiments, the conductive layer 150 is partially removed during the etching process.

In some cases, the exposed portions of the conductive layer 140 may be oxidized during processing. The oxidized portions of the conductive layer 140 are removed until the conductive layer 150 is exposed. As a result, the resistance between the conductive layer 150 and the subsequently formed conductive feature is prevented from being increased undesirably. Therefore, the electrical performance and reliability of the package structure is significantly enhanced.

Figure 1H:
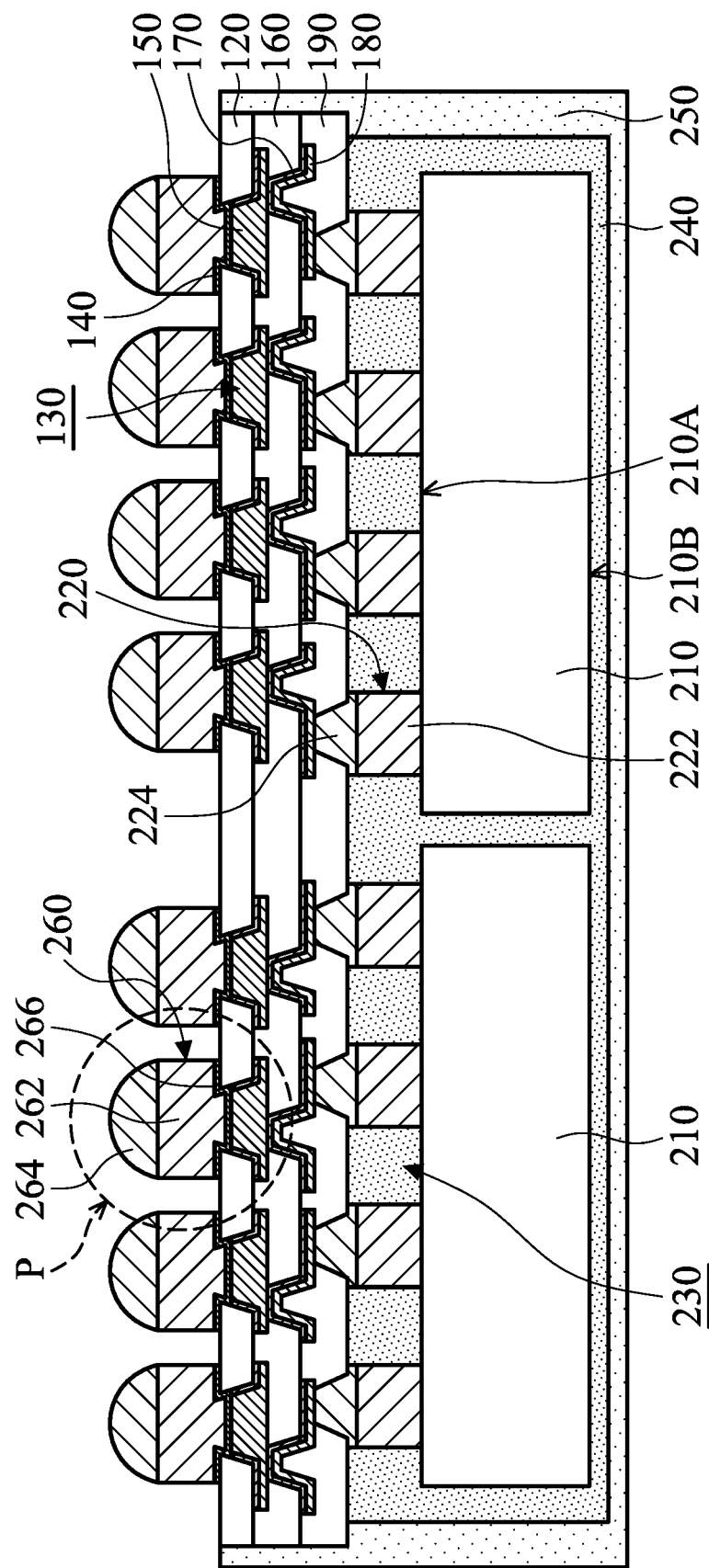

As shown in FIG. 1H, connectors 260 are formed to cover the openings 130, in accordance with some embodiments. As a result, the connectors 260 fill the openings 130 to electrically connect to the integrated circuit dies 210 through the conductive layer 150 in the openings 130. In some embodiments, the connectors 260 and the conductive layers 140 and 150 together fill the openings 130.

In some embodiments, the connectors 260 and the conductive layer 150 in the openings 130 gradually shrink along a direction from the integrated circuit dies 210 towards the connectors 260. In some embodiments, the connectors 260 and the conductive layer 150 in the openings 130 gradually shrink along a direction from the non-active surface 210B toward the active surface 210A of the integrated circuit dies 210. As a result, the conductive layer 150 in the openings 130 has a taper structure.

In some embodiments, each of the connectors 260 includes a conductive layer 266, a conductive bump 262 and a solder layer 264. The conductive bump 252 is between the conductive layer 266 and the solder layer 264.

FIG. 3 shows is an enlarged cross-sectional view of a portion P of the structure shown in FIG. 1H, in accordance with some embodiments. As shown in FIG. 3, the conductive layer 266 extends over the surface 120A of the passivation layer 120 and fills the openings 130, in accordance with some embodiments. The sidewall 120C is covered by the conductive layer 266 and the conductive layer 140. In some embodiments, a portion of the conductive layer 266 is sandwiched between the conductive layer 150 and the conductive bump 262. In some embodiments, the conductive layer 266 is in direct contact with the conductive layers 140 and 150.

In some embodiments, there is an interface 260A between the conductive layer 266 and the conductive layers 140 and 150. In some embodiments, the angle θ between the sidewall 120C and the interface 260A is greater than 0° and is less than or substantially equal to 90°. In some embodiments, the surface 120A of the passivation layer 120 is closer to the interface 260A than the surface 120B of the passivation layer 120.

In some embodiments, the conductive layer 266 is a seed layer. In some embodiments, the conductive layer 266 includes Ti. However, embodiments of the disclosure are not limited thereto. For example, the conductive layer 266 may include Ti alloy, Cu, Cu alloy, another suitable seed material, or a combination thereof. In some embodiments, the conductive layer 266 is deposited using a PVD process, a CVD process, another applicable process, or a combination thereof.

Many variations and/or modifications can be made to embodiments of the disclosure. In some other embodiments, the conductive layer 266 is an under bump metallurgy (UBM) layer. The UBM layer may include a diffusion barrier layer and a seed layer. The seed layer is between the diffusion barrier layer and the conductive bump 262. The diffusion barrier layer may include tantalum nitride, titanium nitride, tantalum, titanium, another suitable material, or a combination thereof.

In some embodiments, the conductive bump 262 extends over the surface 120A and fills the openings 130. In some other embodiments, the conductive bump 262 does not fill the openings 130. The conductive bump 262 may be a conductive pillar, another suitable conductive feature, or a combination thereof. In some embodiments, the conductive bump 262 includes copper, ENIG, ENEPIG, another suitable material, or a combination thereof. In some embodiments, the conductive bump 262 is deposited using an electroplating process, a sputtering process, another applicable process, or a combination thereof. Multiple deposition, coating, and/or etching processes may be used to form the connectors 260 including the conductive layer 266, the conductive bump 262 and the solder layer 264.

Many variations and/or modifications can be made to embodiments of the disclosure. In some other embodiments, the connectors 260 do not include conductive pillars. In some other embodiments, the connectors 260 are solder bumps, solder balls, other suitable connectors, or a combination thereof. In some embodiments, the connectors 260 are controlled collapse chip connection (C4) bumps and/or ball grid array (BGA) bumps.

Figure 1I:
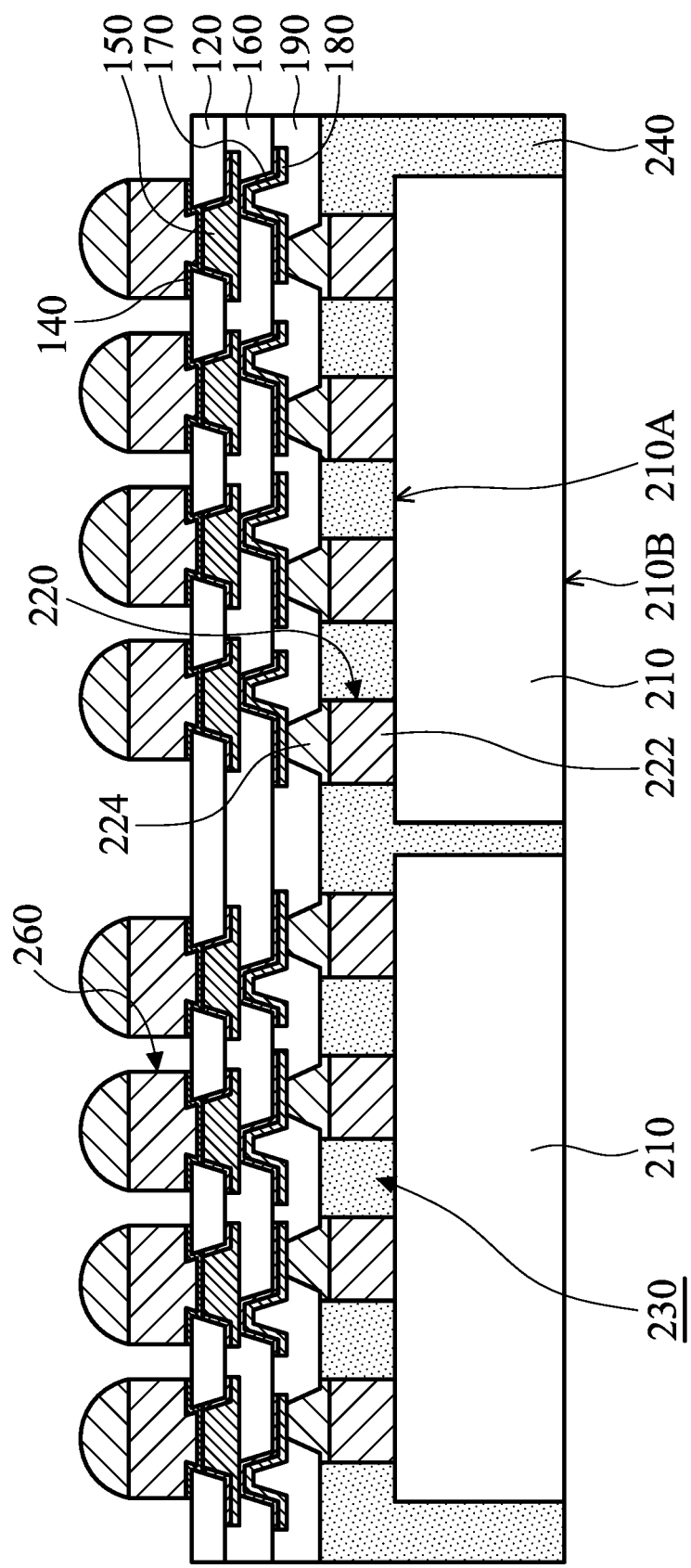

As shown in FIG. 1I, the package layers 240 and 250 are partially removed, in accordance with some embodiments. As a result, the non-active surface 210B of the integrated circuit dies 210 is exposed. It is advantageous for heat dissipation of the integrated circuit dies 210. In some embodiments, the edge 195 stays covered by the package layer 250 during the partial removal of the package layers 240 and 250.

In some embodiments, a planarization process is used to partially remove and thin the package layers 240 and 250. The planarization process includes a grinding process, a chemical mechanical polishing (CMP) process, an etching process, another applicable process, or a combination thereof.

Afterwards, a singulation process is performed to form multiple package structures. Each of the package structures includes one or more integrated circuit dies 210 embedded in the package layer 240, as shown in FIG. 1I. In some embodiments, the singulation process includes a dicing process to cut the package layer 240 and the passivation layer 120 along scribe lines by a saw blade or laser beam. The scribe lines extend around the integrated circuit dies 210 and intersect the edge 195. In some embodiments, each of the package structures is separated from the package layer 250 after the singulation process. As a result, the package layer 250 is removed from each of the package structures, as shown in FIG. 1I.

Although FIG. 1I shows that the non-active surface 210B of the integrated circuit dies 210 is exposed, embodiments of the disclosure are not limited thereto. In some other embodiments, the non-active surface 210B of the integrated circuit dies 210 stays covered by the package layers 240 and 250 during the singulation process. As a result, each of the package structures includes one or more integrated circuit dies 210 covered by the package layers 240 and 250.

Figure 4:
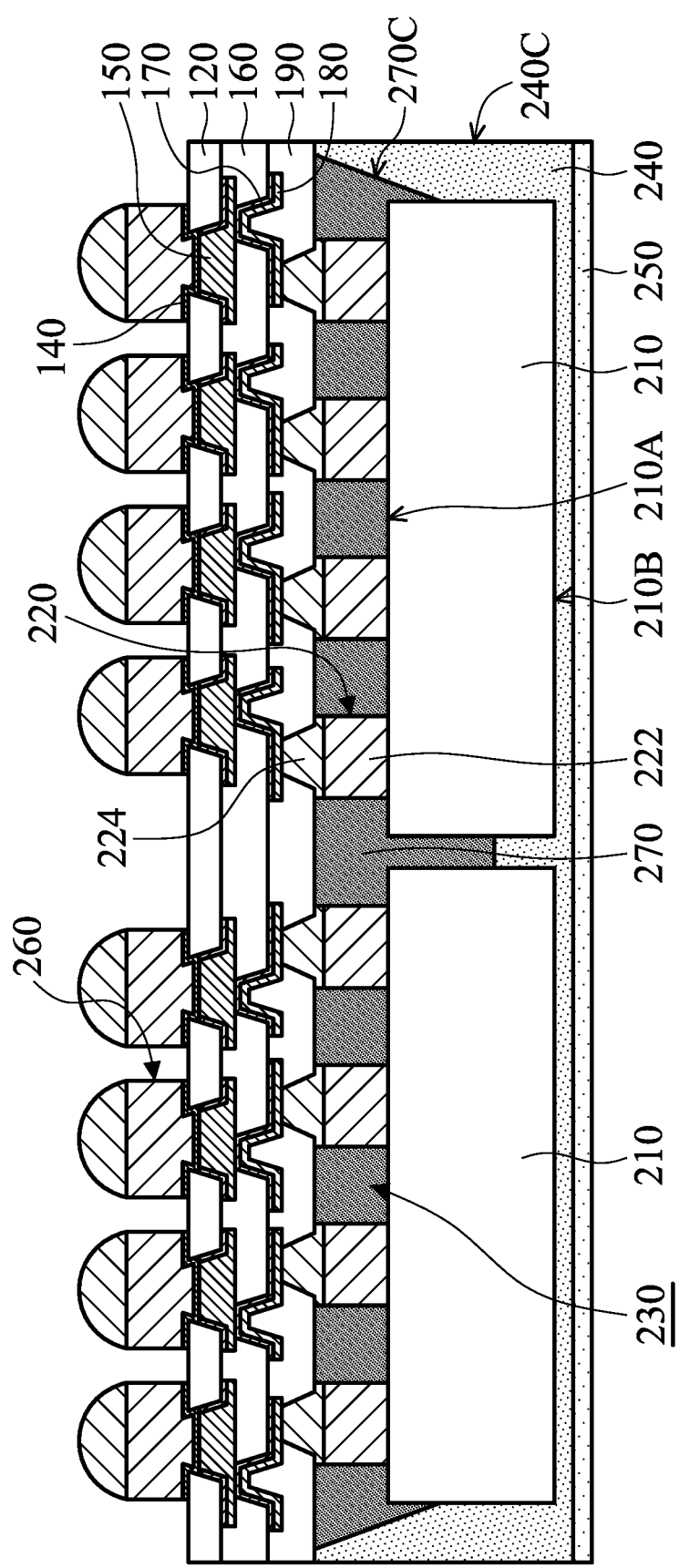
FIG. 4 is a cross-sectional view of a package structure, in accordance with some embodiments.

Many variations and/or modifications can be made to embodiments of the disclosure. FIG. 4 is a cross-sectional view of a package structure, in accordance with some embodiments. In some embodiments, the materials and/or formation methods of the package structure shown in FIG. 4 are similar to those of the package structure shown in FIG. 1I.

As shown in FIG. 4, a package layer 270 fills the space 230 between the active surface 210A of the integrated circuit dies 210 and the passivation layer 190, in accordance with some embodiments. As a result, the connectors 220 are surrounded by the package layer 270. In some embodiments, the package layer 270 does not extend over the non-active surface 210B of the integrated circuit dies 210. As a result, the integrated circuit dies 210 are partially embedded in the package layer 270. In some embodiments, the package layer 270 has a sidewall 270C that is inclined to the sidewall 240C of the package layer 240.

In some embodiments, the package layer 270 includes an underfill material or another suitable encapsulating material. In some embodiments, the package layer 270 includes a material that is different from that of the package layer 240 and/or the package layer 250.

In some embodiments, the package layer 270 has fillers dispersed therein. The fillers may include insulating fibers, insulating particles, other suitable elements, or a combination thereof. In some embodiments, the content or concentration of the fillers dispersed in the package layer 270 is in a range from about 60 wt % to about 85 wt %. In some embodiments, the size of the fillers dispersed in the package layer 270 is in a range from about 5 μm to about 20 μm. In some embodiments, the fillers dispersed in the package layer 240 and/or the package layer 250 have a (maximum) size that is greater than the fillers dispersed in the package layer 270.

In some embodiments, the package layer 270 is formed by a dispensing process, another applicable process, or a combination thereof. In some embodiments, a liquid underfill material is dispensed by capillary action and cured to form the package layer 270. In some embodiments, the package layer 270 is formed before the formation of the package layers 240 and 250.

Although FIG. 4 shows that the package structure has a non-active surface 210B of the integrated circuit dies 210 that is covered by the package layers 240 and 250, embodiments of the disclosure are not limited thereto. In some other embodiments, the package layers 240 and 250 are removed until the non-active surface 210B is exposed. As a result, the package structure does not include the package layer 250.

Figure 5A:
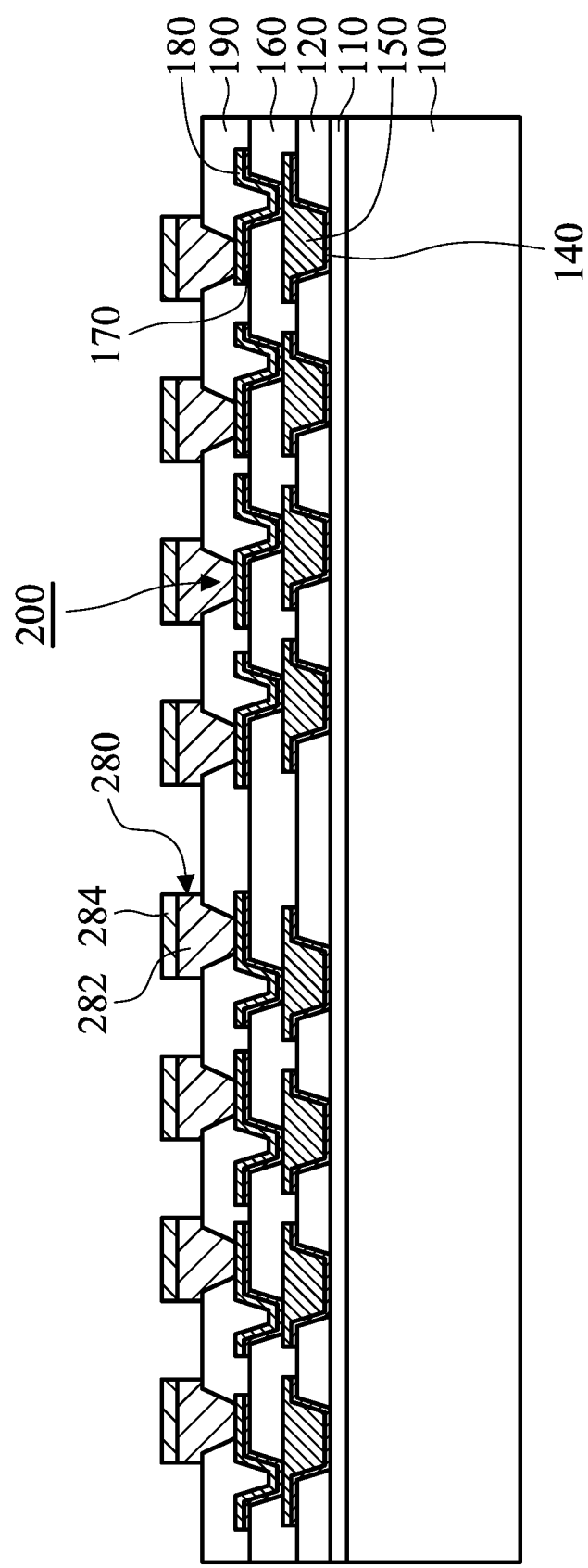
FIGS. 5A and 5B are cross-sectional views of various stages of a process for forming a package structure, in accordance with some embodiments.
Figure 5B:
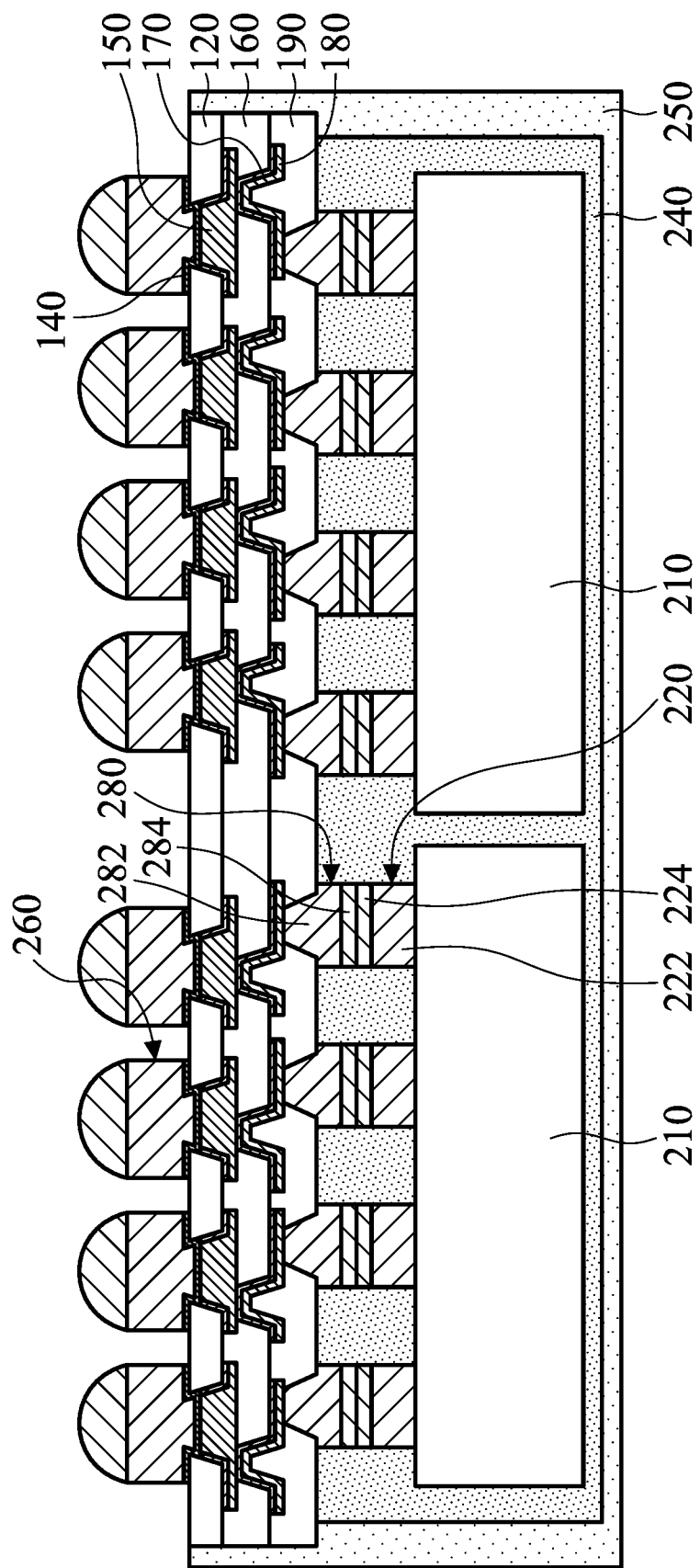

Many variations and/or modifications can be made to embodiments of the disclosure. FIGS. 5A and 5B are cross-sectional views of various stages of a process for forming a package structure, in accordance with some embodiments.

As shown in FIG. 5A, connectors 280 are formed over the passivation layer 190 and fill the openings 200 to electrically connect to the conductive layer 180, in accordance with some embodiments. In some embodiments, each of the connectors 280 includes a conductive bump 282 and a solder layer 284. The conductive bump 282 is between the conductive layer 180 and the solder layer 284. The conductive bump 282 may be a conductive pillar, another suitable conductive feature, or a combination thereof. In some embodiments, the conductive bump 282 includes copper, ENIG, ENEPIG, another suitable material, or a combination thereof.

Embodiments of the disclosure are not limited thereto. In some other embodiments, the connectors 280 include the conductive bump 282 without the solder layer 284. In some other embodiments, the connectors 280 do not include conductive pillars. In some other embodiments, the connectors 280 are solder bumps, solder balls, other suitable connectors, or a combination thereof.

Afterwards, multiple integrated circuit dies 210 are bonded to the conductive layer 180 through the connectors 220 and 280, in accordance with some embodiments. The connectors 220 are coupled to the integrated circuit dies 210 before bonding the integrated circuit dies 210. In some embodiments, a reflow process is performed to bond the solder layer 284 of the connectors 280 and the solder layer 224 of the connectors 220 together.

Subsequently, the steps described in FIGS. 1E-1H are performed to form the structure shown in FIG. 5B. In some embodiments, the package layer 240 fills the space 230 between the integrated circuit dies 210 and the passivation layer 190. As a result, the package layer 240 continuously surrounds the connectors 220 and 280. In some embodiments, the package layer 240 is in direct contact with the connectors 220 and 280. Afterwards, a singulation process is performed over the structure shown in FIG. 5B to form multiple package structures.

Embodiments of the disclosure provide a method for forming a package structure. The method includes forming a redistribution structure over a carrier wafer, and subsequently bonding an integrated circuit die to the redistribution structure through connectors. The method also includes forming a first package layer surrounding the integrated circuit die and the connectors. The first package layer is retracted inwardly from the wafer edge. The method further includes forming a second package layer that covers the sidewall of the first package layer and extends to the wafer edge. Due to the second package layer, it is advantageous for manufacturing equipment to handle or clamp the wafer structure with the first and second package layers. As a result, subsequent processes are successively performed over the wafer structure.

In accordance with some embodiments, the material of the second package layer is selected to control the degree of warpage of the wafer structure. For example, the material of the second package layer may have a high CTE to increase the warpage degree and result in positive warping. Alternatively, the material of the second package layer may have a low CTE to reduce the warpage degree and result in negative warping. As a result, the warpage degree of the wafer structure is compensated for by the second package layer. Accordingly, the package structure is prevented from cracking and has improved planarization. Therefore, the reliability of the package structure is significantly enhanced.

Furthermore, after the carrier wafer is removed, the second package layer provides support during the subsequent processes. No additional carrier wafer is attached to the first package layer. In accordance with some embodiments, the material of choice for the second package layer is substantially not critical. The second package layer may include a molding compound having fillers with a large size, rather than fine fillers. Accordingly, the method for forming the package structure is simple and the fabrication cost of the package structure is greatly reduced.

In addition, since the redistribution structure is formed before bonding the integrated circuit die (i.e., die last process), the integrated circuit die is prevented from being damaged during high-temperature processes for forming the redistribution structure. As a result, thermal loading of the integrated circuit die is reduced. Accordingly, reliability of the package structure is significantly enhanced.

In accordance with some embodiments, a package structure is provided. The package structure includes a package layer. The package structure also includes an integrated circuit die and a first connector embedded in the package layer. The package structure further includes a redistribution layer over the package layer. The integrated circuit die is electrically connected to the redistribution layer through the first connector. In addition, the package structure includes a passivation layer over the redistribution layer. The package structure also includes a second connector over the passivation layer. A first portion of the redistribution layer and a second portion of the second connector extend into the passivation layer. The second portion of the second connector has a tapered profile along a direction from the integrated circuit die towards the first connector.

In accordance with some embodiments, a package structure is provided. The package structure includes a package layer. The package structure also includes an integrated circuit die embedded in the package layer. The integrated circuit die has an active surface and a non-active surface. The package structure further includes a bump embedded in the package layer. The bump is coupled to the active surface. In addition, the package structure includes a redistribution layer over the package layer. The integrated circuit die is electrically connected to the redistribution layer through the bump. The package structure also includes a passivation layer over the redistribution layer. The package structure further includes a connector over the passivation layer. A first portion of the redistribution layer and a second portion of the connector extend into the passivation layer. The first portion gradually shrinks along a direction from the non-active surface toward the active surface.

In accordance with some embodiments, a package structure is provided. The package structure includes a package layer. The package structure also includes an integrated circuit die and a bump embedded in the package layer. The package structure further includes a redistribution layer over the package layer. The integrated circuit die is electrically connected to the redistribution layer through the bump. In addition, the package structure includes a passivation layer over the redistribution layer. A first portion of the redistribution layer extends into the passivation layer. The passivation layer comprises a sidewall adjoining the first portion of the redistribution layer. The package structure also includes a connector over the passivation layer. A second portion of the connector extends into the passivation layer to electrically connect to the redistribution layer. There is an acute angle between the sidewall of the passivation layer and a first surface of the passivation layer facing the connector.

In some embodiments, a method for forming a package structure is provided. The method includes forming a redistribution structure embedded in a passivation layer over a carrier substrate and bonding an integrated circuit die to the redistribution structure through first connectors. The method further includes removing the carrier substrate to expose a bottom portion of the redistribution structure and removing the bottom portion of the redistribution structure to form an opening in the passivation layer. The method further includes forming a second connector over the redistribution structure. In addition, the second connector includes an extending portion extending into the opening in the passivation layer.

In some embodiments, a method for forming a package structure is provided. The method includes forming a passivation layer having an opening over a carrier substrate and forming a redistribution layer in the opening of the passivation layer. The method further includes disposing an integrated circuit die over a first side of the passivation layer and removing the carrier substrate to expose a second side of the passivation layer. The method further includes removing the redistribution layer in a first portion of the opening of the passivation layer and forming a connector over the redistribution layer. In addition, the connector extends into the first portion of the opening.

In some embodiments, a method for forming a package structure is provided. The method includes forming a passivation layer having an opening and forming a redistribution layer in the opening of the passivation layer. The method further includes bonding an integrated circuit die to the passivation layer through first connectors and forming a first package layer around the integrated circuit die and the first connectors. The method further includes removing a portion of the redistribution layer to form an opening in the passivation layer and forming a second connector over the redistribution layer. In addition, the second connector extends into the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, comprising:
   forming a redistribution structure embedded in a passivation layer over a carrier substrate, wherein the redistribution structure comprises a seed layer and a conductive layer over and surrounded by the seed layer;
   bonding an integrated circuit die to the redistribution structure through first connectors;
   removing the carrier substrate to expose a bottom portion of the redistribution structure;

removing the bottom portion of the redistribution structure to form an opening in the passivation layer, wherein a portion of a sidewall of the passivation layer is exposed through the opening, and a rest of the sidewall of the passivation layer is covered by the seed layer; and forming a second connector over the redistribution structure, wherein the second connector comprises an extending portion extending into the opening in the passivation layer.

2. The method for forming the package structure as claimed in claim 1, further comprising:

forming a first package layer surrounding the integrated circuit die and the first connectors before removing the carrier substrate.

3. The method for forming the package structure as claimed in claim 2, further comprising:

forming a second package layer surrounding the first package layer before removing the carrier substrate, wherein the second package layer covers a top surface and a sidewall of the passivation layer.

4. The method for forming the package structure as claimed in claim 1, wherein the first connectors and the second connector are formed at opposite sides of the redistribution structure.

5. The method for forming the package structure as claimed in claim 1, wherein the opening has a slope sidewall.

6. The method for forming the package structure as claimed in claim 1, wherein a width of the extending portion of the second connector gradually increases in a direction toward the integrated circuit die.

7. A method for forming a package structure, comprising:

forming a passivation layer having an opening over a carrier substrate;

forming a redistribution layer in the opening of the passivation layer;

disposing an integrated circuit die over a first side of the passivation layer;

forming a first package layer surrounding the integrated circuit die;

forming a second package layer covering a sidewall of the first package layer;

removing the carrier substrate to expose a second side of the passivation layer;

removing the redistribution layer in a first portion of the opening of the passivation wherein a top surface of the redistribution layer facing the second side of the passivation layer is lower than a top surface of the second package layer facing the second side of the passivation layer; and forming a connector over the redistribution layer, wherein the connector extends into the first portion of the opening.

8. The method for forming the package structure as claimed in claim 7, wherein a first width of the opening at the first side of the passivation layer is greater than a second width of the opening at the second side of the passivation layer.

9. The method for forming the package structure as claimed in claim 7, wherein the opening has a slope sidewall, and an upper portion of the slope sidewall is covered by the connector and a bottom portion of the slope sidewall is covered by the redistribution layer.

10. The method for forming the package structure as claimed in claim 9, wherein the slope sidewall of the opening and a top surface of the second side of the passivation layer form an acute angle.

11. The method for forming the package structure as claimed in claim 7, wherein the first connectors without overlapping an edge portion of the passivation layer.

12. The method for forming the package structure as claimed in claim 11, wherein the second package layer further covers the edge portion of the passivation layer.

13. The method for forming the package structure as claimed in claim 12, wherein the integrated circuit die is electrically connected to the redistribution layer through conductive bumps.

14. The method for forming the package structure as claimed in claim 13, wherein the conductive bumps are embedded in the first package layer and are separated from the second package layer.

15. A method for forming a package structure, comprising:

forming a passivation layer having an opening;

forming a redistribution layer in the opening of the passivation layer;

bonding an integrated circuit die to the passivation layer through first connectors;

forming a first package layer around the integrated circuit die and the first connectors;

forming a second package layer covering a sidewall of the first package layer, wherein a portion of the passivation layer overlaps the second package layer but not the first package layer, and the second package layer covers a sidewall of the passivation layer;

removing a portion of the redistribution layer to form an opening in the passivation layer; and forming a second connector over the redistribution layer, wherein the second connector extends into the opening.

16. The method for forming the package structure as claimed in claim 15, wherein a sidewall of the second connector is coplanar with a sidewall of the redistribution layer.

17. The method for forming the package structure as claimed in claim 15, further comprising:

thinning the first package layer and the second package layer to expose the integrated circuit die.

18. The method for forming the package structure as claimed in claim 15, further comprising:

forming a solder layer over the second connector.

19. The method for forming the package structure as claimed in claim 1, wherein a top surface of the seed layer is level with a top surface of the conductive layer after removing the bottom portion of the redistribution structure.

20. The method for forming the package structure as claimed in claim 3, wherein a bottom surface of the second package layer is level with a bottom surface of the passivation layer.

* * * * *